United States Patent
Wang

(10) Patent No.: US 7,991,097 B2
(45) Date of Patent: Aug. 2, 2011

(54) METHOD AND APPARATUS FOR ADJUSTING SERIAL DATA SIGNAL

(75) Inventor: Hui-Min Wang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 881 days.

(21) Appl. No.: 11/905,797

(22) Filed: Oct. 4, 2007

(65) Prior Publication Data
US 2009/0092211 A1    Apr. 9, 2009

(51) Int. Cl.
*H04L 7/00* (2006.01)
(52) U.S. Cl. ........................................ 375/355; 375/360
(58) Field of Classification Search .................. 375/355, 375/360, 373, 371, 354; 714/707, 700, 744, 714/699, 798, 709
See application file for complete search history.

(56) References Cited

U.S. PATENT DOCUMENTS

| | | | |
|---|---|---|---|
| 6,775,345 B1 * | 8/2004 | Song | 375/376 |
| 6,990,615 B2 * | 1/2006 | Goudie | 714/709 |
| 7,113,560 B1 * | 9/2006 | Huang et al. | 375/355 |
| 7,409,031 B1 * | 8/2008 | Lee et al. | 375/376 |
| 2003/0041292 A1 * | 2/2003 | Lee et al. | 714/700 |
| 2004/0001567 A1 * | 1/2004 | Wei | 375/371 |
| 2004/0117691 A1 * | 6/2004 | Fang | 714/699 |
| 2005/0207520 A1 * | 9/2005 | Su et al. | 375/355 |
| 2006/0227916 A1 * | 10/2006 | Masui et al. | 375/355 |
| 2007/0217559 A1 * | 9/2007 | Stott et al. | 375/355 |

* cited by examiner

*Primary Examiner* — Chieh M Fan
*Assistant Examiner* — Aristocratis Fotakis
(74) *Attorney, Agent, or Firm* — Rabin & Berdo, P.C.

(57) ABSTRACT

A method for adjusting a serial data signal having multiple sets of bits includes the following steps. First, one set of bits in the serial data signal is over-sampled to generate a first set of over-sampled bits. Next, every adjacent two bits of the first set of over-sampled bits are compared to generate one set of edge bits. Then, a delay operation is determined according to the set of edge bits. Afterwards, a displacement operation is executed on next sets of bits in the serial data signal according to the delay operation.

15 Claims, 2 Drawing Sheets

METHOD AND APPARATUS FOR ADJUSTING SERIAL DATA SIGNAL

BACKGROUND OF THE INVENTION

1. Field of the Invention

The invention relates in general to a method and an apparatus for adjusting a serial data signal, and more particularly to a method and an apparatus for adjusting skew of a serial data signal.

2. Description of the Related Art

When a serial data signal is being transmitted, the serial data signal is delayed due to various reasons, such as different loads or changes in the transmission paths, so that a phase difference is generated between the serial data signal and a clock signal, wherein the serial data signal and the clock signal should be originally synchronized. This phenomenon is referred to as skew. When the skew is generated between the serial data signal and the clock signal, the transmission of the serial data signal may have errors after a long period of time has elapsed. Thus, it is an important subject to increase the skew tolerance upon the data transmission of the serial data signal.

SUMMARY OF THE INVENTION

The invention is directed to a method and an apparatus for adjusting skew between a serial data signal and a clock signal so that the serial data signal can be transmitted correctly.

According to a first aspect of the present invention, a method for adjusting a serial data signal including multiple sets of bits is provided. The method includes the following steps. First, one set of bits in the serial data signal is over-sampled to generate a first set of over-sampled bits. Next, every adjacent two bits of the first set of over-sampled bits are compared to generate one set of edge bits. Then, a delay operation is determined according to the set of edge bits. Afterward, a displacement operation is executed on next sets of bits in the serial data signal according to the delay operation.

According to a second aspect of the present invention, an apparatus for adjusting a serial data signal is provided. The apparatus includes an over-sampler, an edge extractor, an edge counter, a delay controller and a digital control delayer. The over-sampler receives the serial data signal to generate one set of over-sampled bits. The edge extractor executes a comparison on every adjacent two over-sampled bits to generate one set of edge bits. The edge counter separately counts the edge bits. The delay controller is coupled to the edge counter and for determining a delay phase for next sets of bits in the serial data signal. The digital control delayer executes a displacement operation on the next sets of bits according to the delay phase.

The invention will become apparent from the following detailed description of the preferred but non-limiting embodiments. The following description is made with reference to the accompanying drawings.

DETAILED DESCRIPTION OF THE INVENTION

The invention provides a method and an apparatus for adjusting skew between a serial data signal and a clock signal so that the serial data signal can be transmitted correctly.

Figure 1:
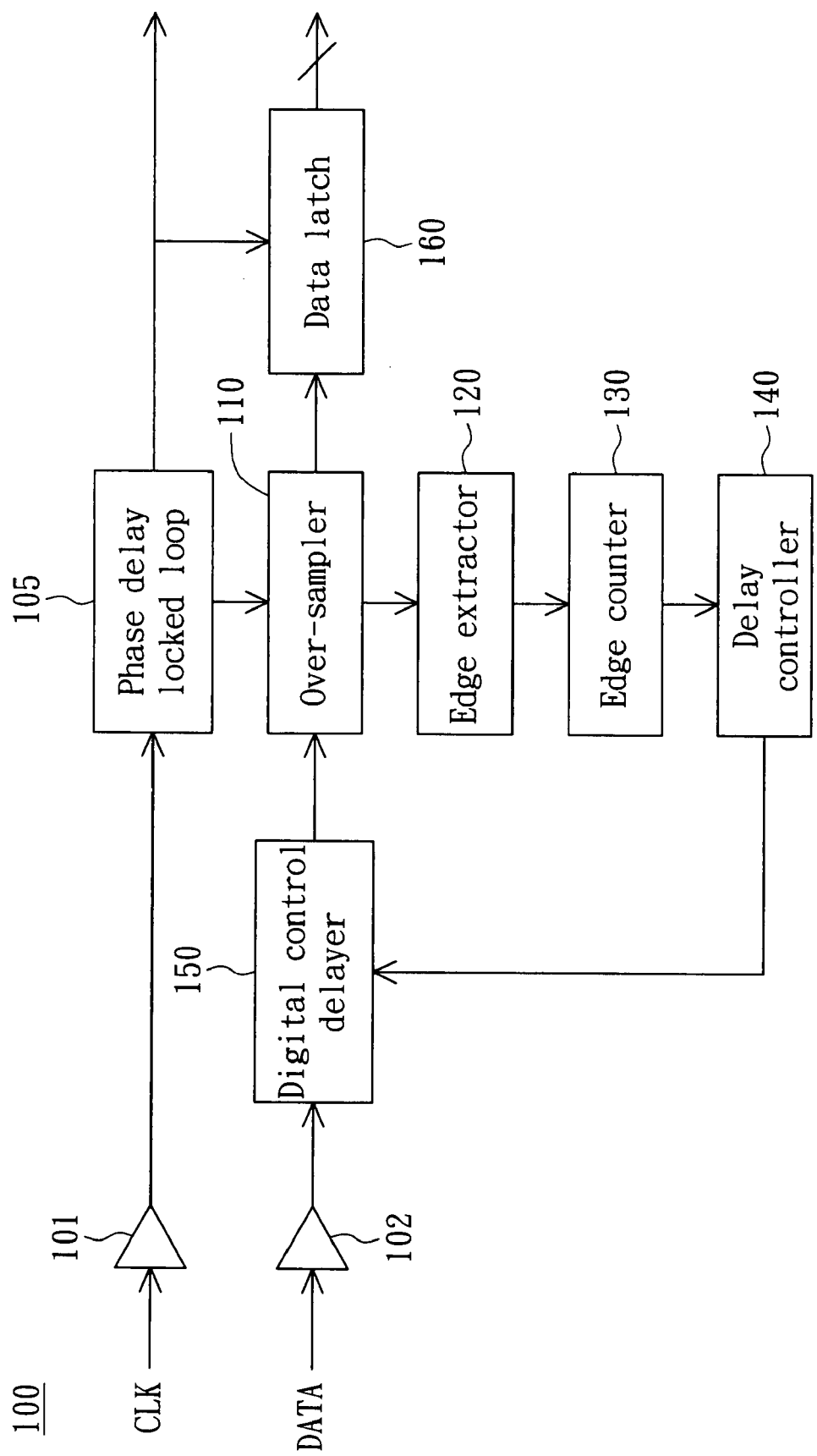
FIG. 1 is a block diagram showing an apparatus for adjusting a serial data signal according to a preferred embodiment of the invention.

FIG. 1 is a block diagram showing an apparatus 100 for adjusting a serial data signal according to a preferred embodiment of the invention. Referring to FIG. 1, the apparatus 100 includes a first amplifier 101, a second amplifier 102, a phase delay locked loop 105, an over-sampler 110, an edge extractor 120, an edge counter 130, a delay controller 140, a digital control delayer 150 and a data latch 160. The first amplifier 101 is for amplifying an original clock signal CLK. The second amplifier 102 is for amplifying a serial data signal DATA, which may include multiple sets of bits.

The phase delay locked loop 105 is for respectively delaying the original clock signal CLK by multiple phases to obtain one set of delayed clock signals, which includes multiple sub-sets of the delayed clock signals. In the apparatus 100, the over-sampler 110 receives the amplified serial data signal DATA, and executes an over-sampling operation on one set of bits in the serial data signal DATA according to the set of delayed clock signals to generate one set of over-sampled bits. Each delayed clock signal corresponds to one over-sampled bit. The over-sampler 110 executes, for example, a three-time over-sampling operation on one set of bits in the serial data signal DATA. The over-sampling operation corresponding to another times may also be executed. Next, the over-sampled bits of "011100011100011000111000" will be illustrated as an example.

The edge extractor 120 executes a comparison on every adjacent two over-sampled bits in the set of over-sampled bits to generate one set of edge bits. The comparison operation executed by the edge extractor 120 may be an XOR operation. Consequently, the set of edge bits obtained by the edge extractor 120 is "010010010010010100100100", and the set of edge bits actually includes multiple sub-sets of the edge bits. Each of the sub-sets of the edge bits includes three edge bits in correspondence with the three-time over-sampling operation executed by the over-sampler 110. The sub-sets of the edge bits are actually classified into "010", "010", "010", "010", "010", "100", "100" and "100".

The edge counter 130 counts the numbers of "1"s corresponding to the sub-sets of the edge bits, compares the numbers of "1"s corresponding to the sub-sets of the edge bits to obtain a reference bit, and outputs a parameter to the delay controller 140 according to the reference bit. The delay controller 140 is coupled to the edge counter 130, and determines a delay phase for next sets of bits of the serial data signal DATA according to the parameter. The reference bit is the bit having the maximum number of "1"s in the sub-sets of the edge bits. Each of the sub-sets of the edge bits substantially includes a left bit, an intermediate bit and a right bit.

In the sub-sets of the edge bits mentioned hereinabove, intermediate bits of five sub-sets of the edge bits are "1", and left bits of three sub-sets of the edge bits are "1". Thus, the reference bit is the intermediate bit, which represents that the skew between the serial data signal DATA and the original clock signal CLK is still within the allowable range, and the delay controller 140 keeps the delay phase according to the parameter. If a power of the reference bit is higher than a power of the intermediate bit, that is, the reference bit is the left bit, it represents that the transmission speed of the serial data signal DATA is too high, and the delay controller 140 increases the delay phase according to the parameter. If the power of the reference bit is lower than the power of the intermediate bit, that is, the reference bit is the right bit, it represents that the transmission speed of the serial data signal DATA is slightly slow, and the delay controller 140 decreases the delay phase according to the parameter. Consequently, the skew between the serial data signal DATA and the original clock signal CLK may be adjusted.

The digital control delayer 150 executes a displacement operation on the next sets of bits of the serial data signal DATA according to the delay phase received from the delay controller 140. The data latch 160 acquires a next set of over-sampled bits, which is obtained by the over-sampler 110 after the displacement of the serial data signal DATA, as one set of parallel bits according to a next one delayed clock signal of the intermediate delayed clock signal of the sub-sets of the delayed clock signals obtained by the phase delay locked loop 105, and outputs the set of parallel bits to another electronic device, such as a data driver. In this embodiment, the 3rd, 6th, 9th, 12th, 15th, 18th, 21st and 24th bits of the over-sampled bits "011100011100011000111000" are acquired to obtain the parallel bits "10101010".

Figure 2:
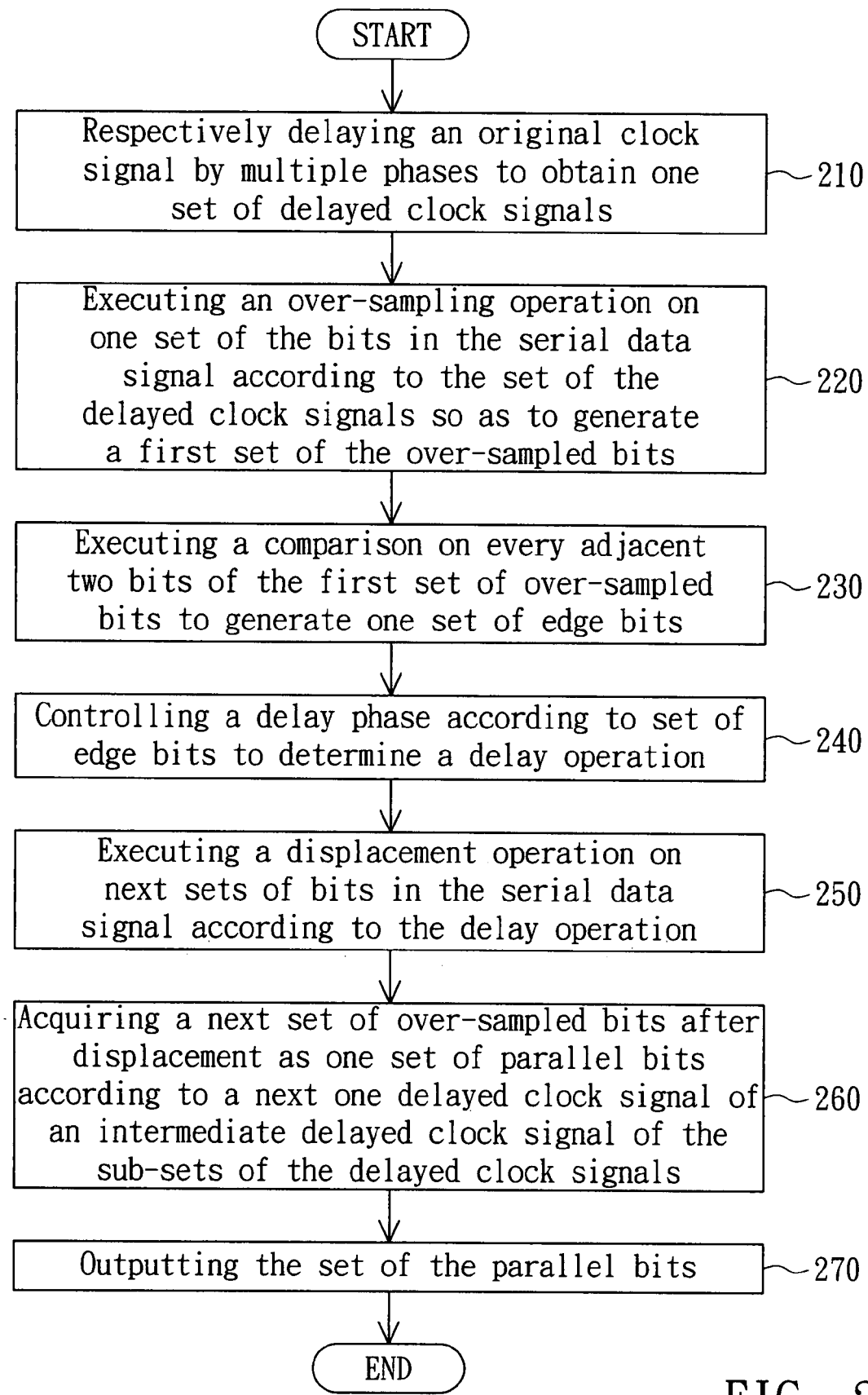
FIG. 2 is a flow chart showing a method for adjusting the serial data signal according to the preferred embodiment of the invention.

The invention also discloses a method for adjusting a serial data signal including multiple sets of bits. FIG. 2 is a flow chart showing a method for adjusting the serial data signal according to the preferred embodiment of the invention. First, in step 210, an original clock signal is respectively delayed by multiple phases to obtain one set of delayed clock signals, which includes multiple sub-sets of the delayed clock signals. Then, in step 220, an over-sampling operation is executed on one set of bits of the serial data signal according to the set of delayed clock signals to generate a first set of over-sampled bits, wherein each delayed clock signal corresponds to one over-sampled bit.

Next, in step 230, a comparison, such as an XOR operation, is executed on every adjacent two bits of the first set of over-sampled bits to generate one set of edge bits. Then, in step 240, a delay phase is controlled according to the set of edge bits to determine a delay operation. Next, in step 250, a displacement operation is executed on next sets of bits in the serial data signal according to the delay operation. Then, in step 260, a next set of over-sampled bits after displacement is acquired as one set of parallel bits according to a next one delayed clock signal of the intermediate delayed clock signal of the sub-sets of the delayed clock signals. Thereafter, in step 270, the set of parallel bits is outputted. The detailed principle of the method for adjusting the serial data signal has been described in the apparatus 100 for adjusting the serial data signal, so detailed descriptions thereof will be omitted.

In the method and apparatus for adjusting the serial data signal according to the embodiment of the invention, a phase delay locked loop and an over-sampler are utilized to execute an over-sampling operation on the serial data signal, and then to compare every adjacent two over-sampled bits and thus to control a delay phase to determine a delay operation. Thus, the skew between the serial data signal and the clock signal can be adjusted so that the serial data signal can be correctly transmitted.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for adjusting a serial data signal, which comprises a plurality of sets of bits, the method comprising the steps of:

over-sampling one set of bits in said serial data signal to generate a first set of over-sampled bits;

executing a comparison on every adjacent two bits of the first set of over-sampled bits to generate one set of edge bits;

determining a delay operation according to the set of edge bits; and executing a displacement operation on next sets of bits in the serial data signal according to the delay operation;

wherein the set of edge bits comprises a plurality of sub-sets of the edge bits; and the step of determining the delay operation comprises:

separately counting the numbers of "1"s corresponding to the sub-sets of the edge bits;

comparing the numbers of "1"s to obtain a reference bit, which is the bit having the maximum number of "1"s in the sub-sets of the edge bits;

controlling a delay phase according to the reference bit to determine the delay operation;

keeping the delay phase when the reference bit is an intermediate bit;

increasing the delay phase when a power of the reference bit is higher than a power of the intermediate bit; and decreasing the delay phase when the power of the reference bit is lower than the power of the intermediate bit.

2. The method according to claim 1, wherein an XOR operation is executed on every adjacent two bits of the first set of over-sampled bits to generate the set of edge bits.

3. The method according to claim 1, further comprising the steps of:

respectively delaying an original clock signal by a plurality of phases to obtain one set of delayed clock signals, which comprises a plurality of sub-sets of the delayed clock signals; and executing odd-numbered times of over-sampling operations on the set of the bits according to the set of the delayed clock signals so as to generate the first set of the over-sampled bits, wherein each of the delayed clock signals corresponds to one of the over-sampled bits.

4. The method according to claim 3, further comprising the steps of:

acquiring a next set of over-sampled bits after displacement as one set of parallel bits according to a next one delayed clock signal of an intermediate delayed clock signal of the sub-sets of the delayed clock signals; and outputting the set of the parallel bits.

5. An apparatus for adjusting a serial data signal, the apparatus comprising:

an over-sampler for receiving the serial data signal to generate one set of over-sampled bits;

an edge extractor for executing a comparison on every adjacent two of the over-sampled bits to generate one set of edge bits;

an edge counter for separately counting the edge bits;

a delay controller coupled to the edge counter and for determining a delay phase for next sets of bits in the serial data signal; and a digital control delayer for executing a displacement operation on the next sets of the bits according to the delay phase;

wherein the edge counter separately counts the numbers of "1"s corresponding to a plurality of sub-sets of the edge bits, and compares the numbers of "1"s to obtain a reference bit and outputs a parameter according to the reference bit, and the delay controller determines the delay phase according to the parameter; and when a power of the reference bit is higher than a power of an intermediate bit, the delay controller increases the delay phase according to the parameter.

6. The apparatus according to claim 5, wherein the serial data signal comprises a plurality of sets of bits, and the over-sampler executes odd-numbered times of over-sampling operations on one of the sets of the bits to generate the set of over-sampled bits.

7. The apparatus according to claim 5, wherein the edge extractor executes an XOR operation on every adjacent two of the over-sampled bits to generate the set of edge bits, which comprises a plurality of the sub-sets of the edge bits.

8. The apparatus according to claim 5, wherein the reference bit is the bit having the maximum number of "1"s in the sub-sets of the edge bits.

9. The apparatus according to claim 8, wherein when the reference bit is the intermediate bit, the delay controller keeps the delay phase according to the parameter.

10. The apparatus according to claim 8, wherein when a power of the reference bit is lower than a power of the intermediate bit, the delay controller decreases the delay phase according to the parameter.

11. The apparatus according to claim 5, further comprising:

a phase delay locked loop for respectively delaying an original clock signal by a plurality of phases to obtain one set of delayed clock signals, which comprises a plurality of sub-sets of the delayed clock signals.

12. The apparatus according to claim 11, wherein the over-sampler executes an over-sampling operation on the serial data signal according to the set of the delayed clock signals so as to generate the set of the over-sampled bits, and each of the delayed clock signals corresponds to one of the over-sampled bits.

13. The apparatus according to claim 12, further comprising:

a data latch for acquiring a next set of over-sampled bits after displacement as one set of parallel bits according to a next one delayed clock signal of an intermediate delayed clock signal of the sub-sets of the delayed clock signals, and outputting the set of the parallel bits.

14. The apparatus according to claim 11, further comprising:

a first amplifier for amplifying the original clock signal.

15. The apparatus according to claim 5, further comprising:

a second amplifier for amplifying the serial data signal.

* * * * *